(12) United States Patent
Duan et al.

(10) Patent No.: US 6,978,407 B2
(45) Date of Patent: Dec. 20, 2005

(54) METHOD AND ARCHITECTURE FOR DETECTING RANDOM AND SYSTEMATIC TRANSISTOR DEGRADATION FOR TRANSISTOR RELIABILITY EVALUATION IN HIGH-DENSITY MEMORY

(75) Inventors: Franklin L. Duan, San Jose, CA (US); Subramanian Ramesh, Cupertino, CA (US); Ruggero Castagnetti, Menlo Park, CA (US)

(73) Assignee: LSI Logic Corporation, Milpitas, CA (US)

( * ) Notice: Subject to any disclaimer, the term of this patent is extended or adjusted under 35 U.S.C. 154(b) by 414 days.

(21) Appl. No.: 10/445,437

(22) Filed: May 27, 2003

(65) Prior Publication Data

US 2004/0243890 A1 Dec. 2, 2004

(51) Int. Cl.[7] .............................................. G11C 29/00
(52) U.S. Cl. ....................... 714/721; 714/732
(58) Field of Search .................. 438/242; 439/638; 324/754; 365/201; 714/721, 732

(56) References Cited

U.S. PATENT DOCUMENTS

| | | | |
|---|---|---|---|
| 6,235,575 B1 * | 5/2001 | Kasai et al. | 438/242 |
| 6,447,339 B1 * | 9/2002 | Reed et al. | 439/638 |
| 6,636,058 B2 * | 10/2003 | Lyford | 324/754 |
| 6,639,859 B2 * | 10/2003 | Tran | 365/201 |
| 6,781,391 B2 * | 8/2004 | Reed et al. | 324/754 |

* cited by examiner

*Primary Examiner*—David Ton
(74) *Attorney, Agent, or Firm*—Yee & Associates

(57) ABSTRACT

A self-aligning memory cell design is provided to allow testing of transistors in every cell of a memory circuit. A test array of these cells is fabricated with contact pads in each cell for specific components in the cell. Then, metal lines are provided to couple the contact pads in the test array. The whole test array is then probed via these metal lines. Tests may then be performed to detect random and systematic transistor degradation electrically for all cells in the circuit. Different components in the memory design may be tested by providing contact pads for the components of interest and providing metal lines coupling the contact pads.

16 Claims, 5 Drawing Sheets

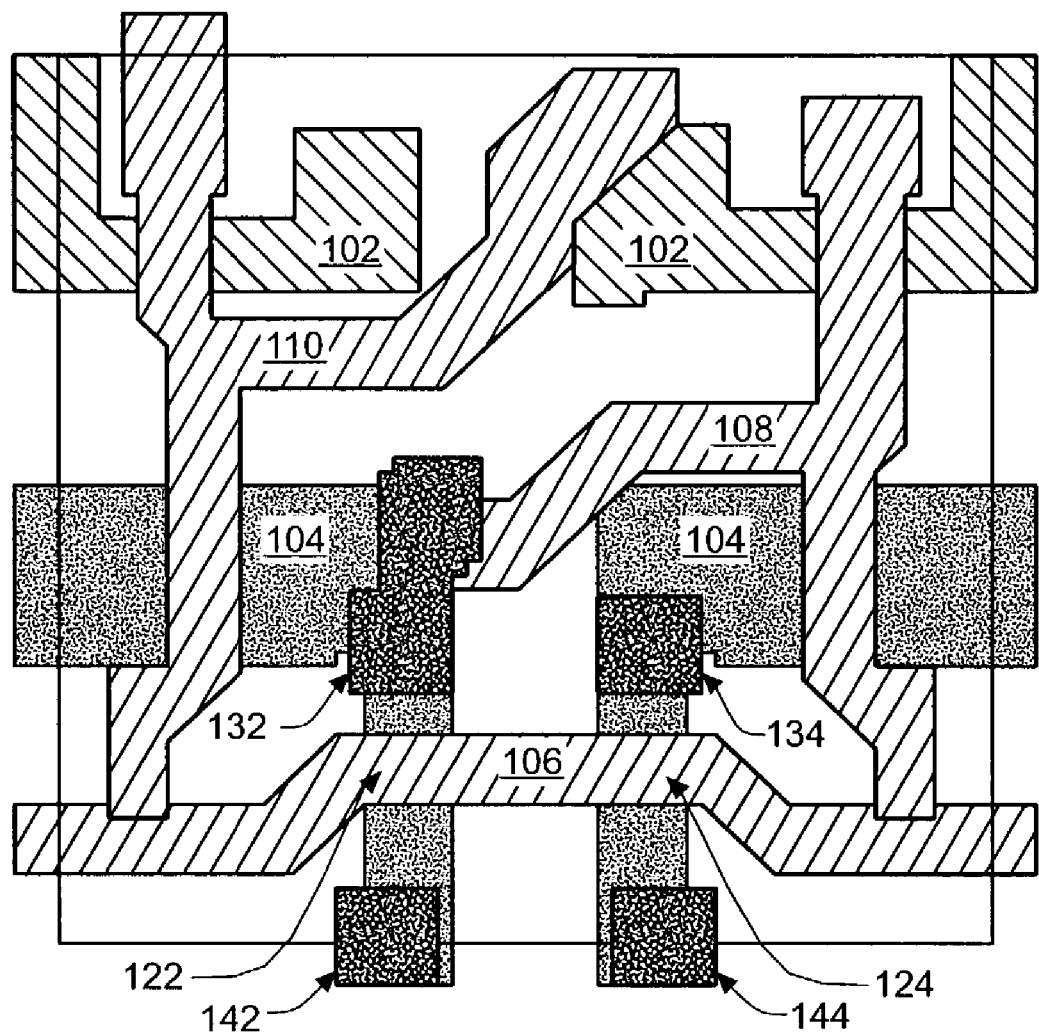
FIG._1

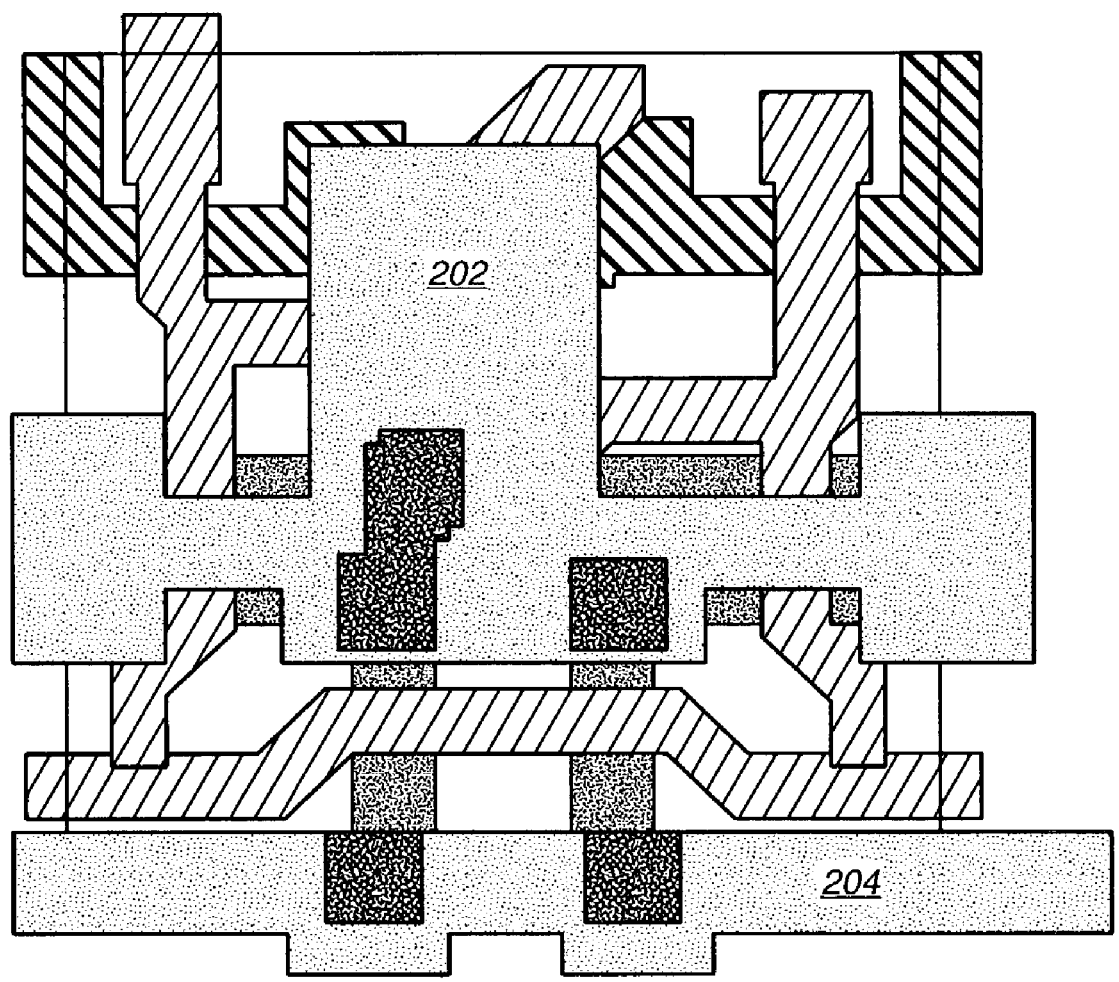
FIG._2

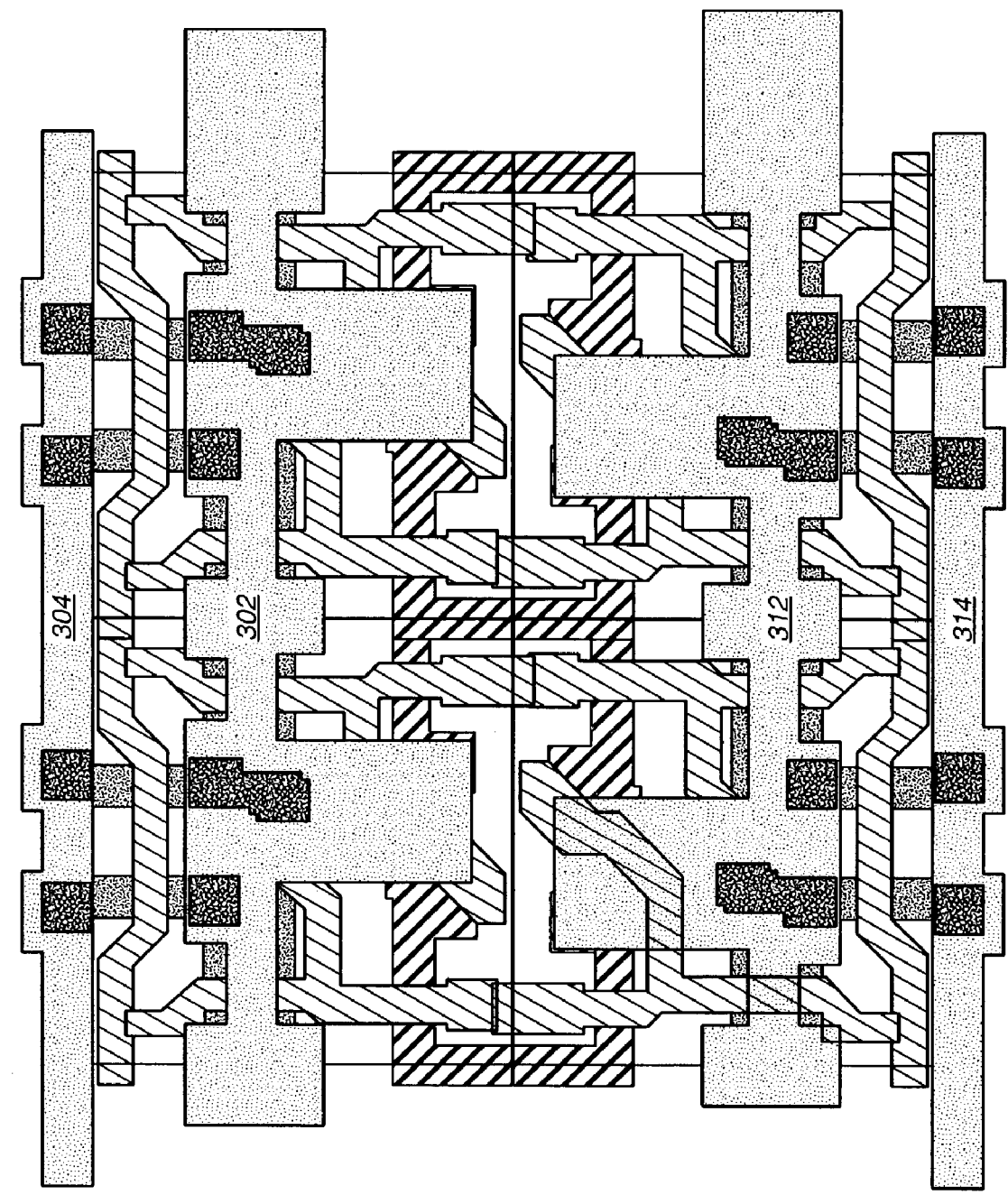
FIG._3

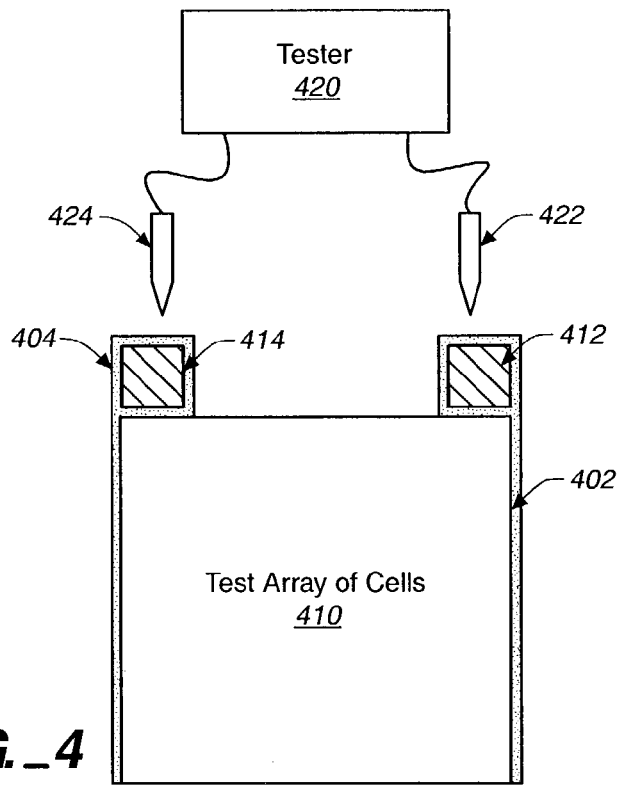
FIG._4
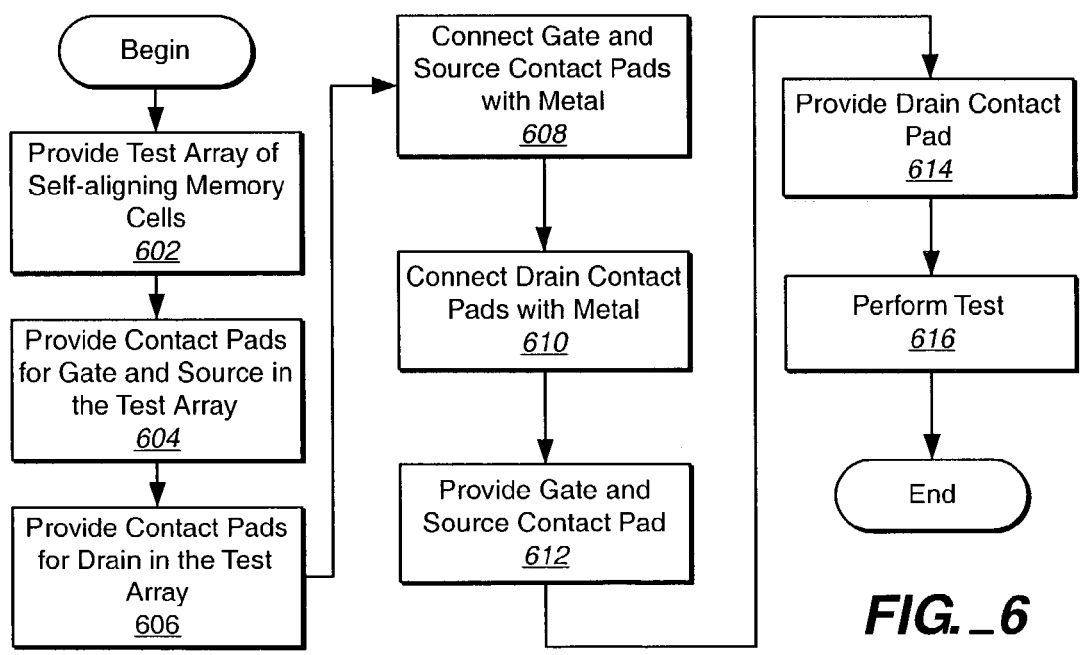
FIG._6

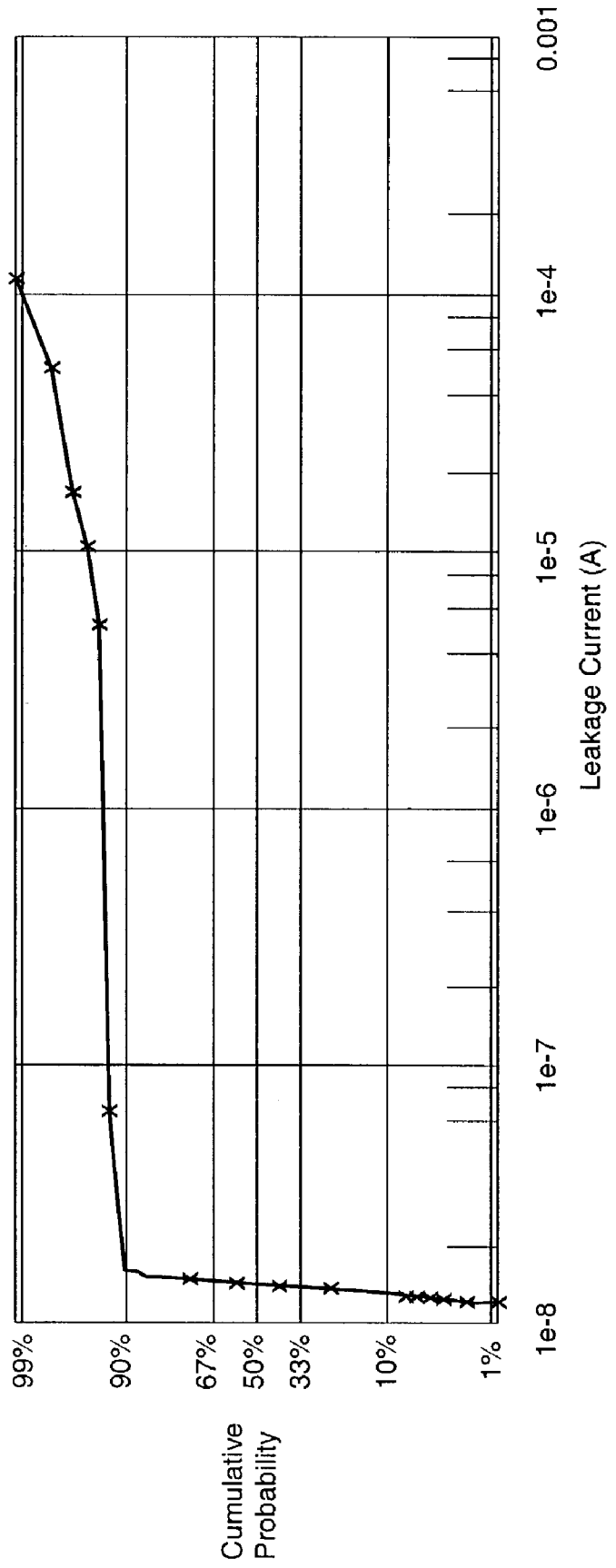
FIG._5

METHOD AND ARCHITECTURE FOR DETECTING RANDOM AND SYSTEMATIC TRANSISTOR DEGRADATION FOR TRANSISTOR RELIABILITY EVALUATION IN HIGH-DENSITY MEMORY

BACKGROUND OF THE INVENTION

1. Technical Field

The present invention is directed generally toward high-density memory architecture and, in particular, to component testing in high-density memories. Still more particularly, the present invention provides a method and architecture for detecting random and systematic transistor degradation for transistor reliability evaluation in high-density memory.

2. Description of the Related Art

In the computer and electronics industry, there is a constant desire to make circuits, particularly integrated circuits, faster and smaller. Making circuits smaller allows many more components to be packed into a chip, increasing functionality and performance. This is particularly true with memory circuits. Increasing the density of components in a memory chip allows for many more memory cells to be fabricated in a memory chip, thus increasing the amount of memory on chip.

However, higher-density circuits pose several problems. In an integrated circuit, components are formed using channels of highly doped silicon, channels of polysilicon, and layers of insulation. Recently, the channel lengths have decreased from 400 nanometers (nm) to as small as 90 nm and will likely decrease even further. These small channel lengths allow components, particularly transistors, to be tightly packed. However, with these small channel lengths transistors and other components become more difficult to fabricate without defects.

A traditional reliability test is the hot carrier injection (HCI) test on a single transistor. This test can extensively study the various degradation mechanisms on a transistor, such as threshold voltage shift and channel leakage current. This test can also provide information on the possible process weaknesses relating to a certain degradation and hint for improvements. Yet this single transistor case may not be able to indicate the failure possibility in millions to billions of transistors on the chip.

A wafer may have fabricated thereon as many as a few tens of instances of a circuit. Thus, when testing a single transistor, only a few tens of transistors will be tested on a wafer, one from each circuit. However, defects are typically random and the probability of detecting a defect using a single transistor test is very low.

Moreover, transistors in high-density memory may behave differently than a single transistor, even drawn with the same size, due to the different environment and density. Even by measuring many transistors from these single-transistor instances, the data may not represent exactly the possible weakness or defect in the transistors in the high-density memory. Furthermore, the existing physical failure analysis process (such as parallel capping or cross-sectioning of failing circuits) used to detect and analyze defects and degradations is usually time-consuming. Hence, quick feedback to process development is not possible with these techniques. Therefore, it would be advantageous to provide an improved method and architecture which is able to detect random and systematic transistor defects and degradation within the millions of transistors in the high-density memory circuit and in the very early stage of the process development.

SUMMARY OF THE INVENTION

The present invention provides a method for designing a self-aligning memory cell to allow testing of transistors in every cell of a memory circuit. These self-aligning memory cells may be used to build a test array with contact plugs in each cell. These contact plugs may then be connected via metal lines to allow testing of the whole array for such specific components of the memory cell. Thus, all of the self-aligning memory cells are connected to allow probing of the whole test array via these metal lines. As such, the present invention provides a unique architecture to electrically detect random and systematic transistor degradation for all cells in the circuit.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 depicts an example self-aligning memory cell in accordance with a preferred embodiment of the present invention;

FIG. 2 depicts an example self-aligning memory cell with metal lines connecting contact pads in accordance with a preferred embodiment of the present invention;

FIG. 3 illustrates an example array of self-aligning cells in accordance with a preferred embodiment of the present invention;

FIG. 4 is an example test configuration in accordance with a preferred embodiment of the present invention;

FIG. 5 illustrates an example experimental curve to analyze the leakage current failure in accordance with a preferred embodiment of the present invention; and FIG. 6 is a flowchart illustrating the operation of a reliability test in accordance with a preferred embodiment of the present invention.

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

With reference now to the figures and in particular with reference to FIG. 1, an example self-aligning memory cell is shown in accordance with a preferred embodiment of the present invention. The self-aligning memory cell includes highly doped P+ type silicon channels 102 and highly doped N+ type silicon channels 104. The doped channels are called diffusion. The cell is covered with insulation and polysilicon channels 106, 108, 110 are positioned over the insulation.

Polysilicon (poly) is silicon in a polycrystal state. The poly is similar in conductivity to metal. An overlap of diffusion and poly forms a gate. Thus, transistors 122, 124 are formed at the overlap of the highly doped N+ type silicon channels 104 and the poly 106, as known in the art.

In a preferred embodiment of the present invention, the memory cell shown in FIG. 1 is self-aligning. Contact pads 132, 134 provide electrical contacts for the source nodes of transistors 122, 124, respectively. Also, the source diffusion 104 and poly silicon gate 106 are tied together via contact pad 132 and poly 108. Contact pads 142, 144 provide electrical contacts for the drain nodes of transistors 122, 124, respectively. Contact pads 132, 134 and contact pads 142, 144 align such that the two transistors can be connected in parallel. Also, when the cells are fabricated in an array, all of the transistors 122, 124 for a row of cells can be connected in parallel and tested together. As such, the memory cell shown in FIG. 1 is self-aligning to allow for an improved test array.

In the example shown in FIG. 1, transistors 122, 124 are being tested. However, other components in the memory cell may be tested. For example, contact pads 134, 144 may be removed and only one transistor per cell may be tested. Additional contact pads may also be included to test more transistors. Moreover, other components may also be tested using the self-aligning memory cell of the present invention.

With reference now to FIG. 2, an example self-aligning memory cell is shown with metal lines connecting contact pads in accordance with a preferred embodiment of the present invention. The contact pads for the source and gate nodes are connected by metal line 202. The contact pads for the drain nodes are connected by metal line 204. Therefore, both of the transistors of interest in the self-aligning memory cell can be probed via metal lines 202, 204.

FIG. 3 illustrates an example array of self-aligning cells in accordance with a preferred embodiment of the present invention. The contact pads for the source and gate nodes are connected by metal lines 302, 312. The contact pads for the drain nodes are connected by metal lines 304, 314. Therefore, all of the transistors of interest in the self-aligning memory cells can be probed via metal lines 302, 304, 312, and 314. In the example shown in FIG. 3, only four cells are shown. However, a memory circuit will typically include thousands of such cells, therefore the memory test array is built into a few thousands of instances with the cell in FIG. 3. The results from this test array truly reflect the real situation in product.

Turning now to FIG. 4, an example test configuration is shown in accordance with a preferred embodiment of the present invention. Test array 410 of self-aligning memory cells is provided on a test wafer. In practice, more test arrays may be provided on a wafer, since multiple circuits are typically fabricated on a wafer. The test array includes tens of thousands to hundreds of thousands of memory cells. Metal line 402 connects the source and gate nodes of the transistors of interest in the array. For example, metal line 402 connects to metal lines 302, 312 in FIG. 3. Metal line 404 connects the drain nodes of the transistors of interest in the array. For example, metal line 404 connects to metal line 304, 314 in FIG. 3. Contact pad 412 is provided for metal line 402 and contact pad 414 is provided for metal line 404.

Tester 420 tests for random and systematic defects inside the transistor array and tests for transistor degradation. Probe 422 contacts pad 412 and probe 424 contacts pad 414. By monitoring the leakage current between pad 412 and 414, any possible random and/or systematic defects can be observed as a distribution tail in the distribution chart. An example for such a measurement is shown in FIG. 5. Transistor reliability can be evaluated by stressing the test array by applying higher voltage (30% higher than the operating voltage) between pad 414 and 412 under high temperature (e.g., 150 C). By monitoring the leakage current behavior versus stressing time, transistor degradation can be observed by abnormal leakage current behavior versus stressing time.

Alternatively, the gate and source nodes can be separated and the tester can control the gates of some transistors for the worst-condition transistor reliability studies. Usually the worst-case transistor stressing test is either when the gate voltage is equal to half of the drain voltage or close to the transistor threshold voltage.

With reference to FIG. 6, a flowchart is shown illustrating the operation of a reliability test in accordance with a preferred embodiment of the present invention. The process begins and provides a test array of self-aligning memory cells (step 602). Then, the process provides contact pads for gate and source nodes of transistors of interest in the test array (step 604) and provides contact pads for drain nodes of transistors of interest in the test array (step 606).

Thereafter, the process connects the gate and source contact pads with metal lines (step 608). Then, the process connects the drain contact pads with metal lines (step 610). The process then provides a gate and source contact pad (step 612) and provides a drain contact pad (step 614). Finally, the process performs a test (step 616) by probing the gate and source contact pad and the drain contact pad. Thereafter, the process ends.

Thus, the present invention solves the disadvantages of the prior art by providing a self-aligning memory cell design to allow testing of transistors in every cell of a memory circuit. A test array of these cells is fabricated with contact pads in each cell for specific components of interest. Then, metal lines are provided to couple the contact pads in the test array. The whole test array is then probed via these metal lines. Tests may then be performed to detect random and systematic transistor degradation electrically for all cells in the circuit. Different components in the memory design may be tested by providing contact pads for the components of interest and providing metal lines coupling the contact pads.

What is claimed is:

1. A method for testing a memory circuit, comprising:
   providing a test array of self-aligning memory cells;
   providing component contact pads for at least one component of interest in each cell;
   connecting the component contact pads with metal lines;
   providing probe contact pads for the metal lines; and
   probing the probe contact pads.

2. The method of claim 1, wherein the at least one component of interest includes one or more transistors.

3. The method of claim 2, further comprising:
   performing a transistor degradation test on the test array.

4. The method of claim 3, wherein the step of performing a transistor degradation test includes:
   applying a test voltage to the probe contact pads, wherein the test voltage is higher than the normal operating voltage of the at least one component of interest.

5. The method of claim 4, wherein the test voltage is 30% higher than the normal operating voltage of the at least one component of interest.

6. The method of claim 4, further comprising:
   monitoring leakage current versus stressing time.

7. The method of claim 6, further comprising:
determining whether the leakage current versus stressing time behavior is abnormal.

8. The method of claim 2, further comprising:
performing a worst-condition transistor reliability study on the test array.

9. An apparatus for testing a memory, comprising:
a test array of self-aligning memory cells, wherein each self-aligning memory cell has component contact pads for at least one component of interest;
metal lines drawn to connect the component contact pads; and
probe contact pads for the metal lines.

10. The apparatus of claim 9, further comprising:
a tester; and
a set of probes,
wherein, responsive to the probes contacting the probe contact pads, the tester performs a component test on the test array.

11. The apparatus of claim 10, wherein the at least one component includes one or more transistors.

12. The apparatus of claim 11, wherein the component test is a transistor degradation test.

13. The apparatus of claim 12, wherein the tester applies a test voltage to the probe contact pads, wherein the test voltage is higher than the normal operating voltage of the at least one component of interest.

14. The apparatus of claim 13, wherein the test voltage is 30% higher than the normal operating voltage of the at least one component of interest.

15. The apparatus of claim 13, wherein the tester monitors leakage current versus stressing time.

16. The apparatus of claim 11, wherein the tester performs a worst-condition transistor reliability study on the test array.

* * * * *